(12) United States Patent
Uchida et al.

(10) Patent No.: US 7,332,229 B2
(45) Date of Patent: *Feb. 19, 2008

(54) VARNISH, SHAPED ITEM, ELECTRICAL INSULATING FILM, LAMINATE, FLAME RETARDANT SLURRY AND PROCESS FOR PRODUCING FLAME RETARDANT PARTICLES AND VARNISH

(75) Inventors: Daisuke Uchida, Tokyo (JP); Masafumi Kawasaki, Tokyo (JP); Yasuhiro Wakizaka, Tokyo (JP); Atsushi Tsukamoto, Tokyo (JP)

(73) Assignee: Zeon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/511,143

(22) PCT Filed: Apr. 15, 2003

(86) PCT No.: PCT/JP03/04786

§ 371 (c)(1),
(2), (4) Date: Oct. 14, 2004

(87) PCT Pub. No.: WO03/087235

PCT Pub. Date: Oct. 23, 2003

(65) Prior Publication Data

US 2005/0159509 A1    Jul. 21, 2005

(30) Foreign Application Priority Data

Apr. 15, 2002 (JP) .............................. 2002-112736
Jun. 28, 2002 (JP) .............................. 2002-190548

(51) Int. Cl.
B32B 9/00    (2006.01)
(52) U.S. Cl. ................. 428/472.3; 428/209; 428/405; 428/425.9; 442/136; 174/258
(58) Field of Classification Search ............... 428/209, 428/405, 425.9, 472.3; 174/258; 524/436, 524/437; 442/136
See application file for complete search history.

(56) References Cited

U.S. PATENT DOCUMENTS

| | | | | |
|---|---|---|---|---|
| 6,130,282 A * | 10/2000 | Imahashi et al. | ............ | 524/436 |
| 6,280,839 B1 * | 8/2001 | Brown et al. | ................ | 428/328 |
| 6,303,681 B1 * | 10/2001 | Furukawa et al. | .......... | 524/436 |
| 6,319,619 B1 * | 11/2001 | Yamamoto et al. | ......... | 428/620 |
| 6,676,920 B1 * | 1/2004 | Oishi et al. | ................ | 423/635 |
| 6,955,848 B2 * | 10/2005 | Wakizaka et al. | ........... | 428/209 |

FOREIGN PATENT DOCUMENTS

| | | |
|---|---|---|
| EP | 0757015 A | 2/1997 |
| EP | 1197514 A1 | 4/2002 |
| JP | 1-294792 A | 11/1989 |
| JP | 3-166256 A | 7/1991 |
| JP | 9-13037 A | 1/1997 |
| JP | 9-183919 A | 7/1997 |
| JP | 9-213140 A | 8/1997 |
| JP | 10-60447 A | 3/1998 |
| JP | 10-226789 A | 8/1998 |
| JP | 10-306082 A | 11/1998 |
| JP | 11-61134 A | 3/1999 |
| JP | 2000-345006 A | 12/2000 |
| JP | 2001-156409 A | 6/2001 |
| JP | 2001-1724857 A | 6/2001 |
| JP | 2002-121394 A | 4/2002 |
| JP | 2003-82291 A | 3/2003 |
| WO | WO-01/09234 A1 | 2/2001 |

* cited by examiner

*Primary Examiner*—Cathy F. Lam
(74) *Attorney, Agent, or Firm*—Birch, Stewart, Kolasch & Birch, LLP

(57) ABSTRACT

The invention provides a varnish that contains an insulting resin, a curing agent, a flame retardant, and an organic solvent. The flame retardant comprises flame retardant particles surface treated with at least one surface treatment agent selected from the group consisting of a phosphorus compound soluble in an organic solvent, an organosilicon compound and a dispersant having a carboxyl group. A formed material is obtained by applying and drying the varnish on a substrate. A multilayer structure is obtained by forming on a substrate having a conductor circuit layer an electrical insulation layer obtained by curing the formed material obtained from the varnish.

19 Claims, No Drawings

VARNISH, SHAPED ITEM, ELECTRICAL INSULATING FILM, LAMINATE, FLAME RETARDANT SLURRY AND PROCESS FOR PRODUCING FLAME RETARDANT PARTICLES AND VARNISH

TECHNICAL FIELD

The present invention relates generally to a varnish comprising a curable resin composition well fit for the production of electrical insulation films, and more particularly to a varnish comprising a curable resin composition, which has improved flame retardancy and electrical insulation with the ability to form an electrical insulation film that does not suffer from a drop of resistance to high temperature and humidity.

Further, the present invention pertains to a formed material such as a film or sheet obtained with such a varnish, an electrical insulation film obtained by curing said formed material, and a multilayer structure with said electrical insulation film mounted as an electrical insulation film on a circuit board.

Furthermore, the present invention is concerned with a process for the preparation of flame retardant particles for incorporation in that varnish, a flame retardant slurry containing said flame retardant particles, and a process for the preparation of a varnish using said flame retardant slurry.

BACKGROUND ART

With increasingly slimed down, more multifunctional electronic devices, much higher densities are now in demand for circuit boards used therewith, too.

Among known approaches to enhancing the density of circuit boards, there is a method for fabricating a circuit board in a multilayered form. The multilayered circuit board (also referred to as a multilayer circuit board) may usually be obtained by a process of laminating a second electrical insulation layer (2) on an internal layer substrate comprising an electrical insulation layer (1) and a conductor circuit (a) formed on its surface and forming a second conductor circuit (b) on the second electrical insulation layer (2), and repeating that process as many times as necessary if required, whereby given alternations of insulation layers and conductor circuits are obtained.

Application of high-density wires to electronic equipment of multilayer structure causes its board or electronic device to generate heat as such during operation. To fend off setting fire by heat generation, flame retardants are usually incorporated in the electrical insulation layers. For the flame retardants, those insoluble in organic solvents are widely used. Among those flame retardants, preference is given to halogen-free flame retardants such as salts of basic nitrogenous compounds and phosphoric acid in consideration of environments.

For instance, the inventors have come up with a curable resin composition that contains an insulation resin and halogen-free flame retardant particles having a primary particle average major axis of 0.01 to 5 µm, an aspect ratio of up to 5 and the proportion of particles having a major axis of greater than 10 µm being at most 10% by number (JP(A)2002-121394). Such halogen-free flame retardant particles, for instance, may be prepared by wet milling of a salt of a basic nitrogenous compound and phosphoric acid in a mixed solvent comprising a polar solvent and a non-polar solvent. The curable resin composition is used as a varnish while an insulting resin and halogen-free flame retardant particles are dissolved or dispersed in an organic solvent.

DISCLOSURE OF THE INVENTION

Inventors' further research has turned out that if halogen-free flame retardant particles are dispersed in a varnish containing an insulation resin, a curing agent and an organic solvent by means of the method set forth in the above publication, the flame retardant particles agglomerate in the varnish with time.

When an electrical insulation film is formed on a circuit board using a varnish containing a large amount of secondary coarse particles resulting from the agglomeration of flame retardant particles, electrical properties such as interlayer insulation resistance become insufficient. In addition, an electrical insulation film containing flame retardant particle agglomerations tends to yield particulate deposits on the surface of the film under high temperature-and-humidity conditions. Those particulate deposits on the surface of the electrical insulation film have adverse influences on interlayer insulation, flame retardancy, robustness, etc.

It is therefore one object of the invention to provide a varnish comprising a curable resin composition capable of forming an electrical insulation layer that has improved flame retardancy and stabilized electrical properties such as interlayer insulation resistance, and its preparation process.

Another object of the invention is to provide a varnish comprising a curable resin composition capable of an electrical insulation film that has improved flame retardancy and electrical properties and is of improved resistance under high temperature-and-humidity conditions, and its preparation process.

Yet another object of the invention is to provide a formed material such as a film or sheet obtained using the varnish having such improved properties, an electrical insulation film obtained by curing said formed material, and a multilayer structure with said electrical insulation film mounted as an electrical insulation layer on a circuit board.

A further object of the invention is to provide a process for the preparation of flame retardant particles for incorporation in such varnish, a flame retardant slurry containing said flame retardant particles, and a varnish preparation process using said flame retardant slurry.

The inventors have made study after study for the purpose of accomplishing the aforesaid objects, and have consequently found that if a flame retardant is surface-treated in an organic solvent with at least one surface treatment agent selected from the group consisting of a phosphorus compound soluble in an organic solvent, an organosilicon compound and a dispersant containing a carboxyl group, it is then possible to obtain flame retardant particles that are outstandingly improved in terms of dispersibility in a varnish. The surface-treated flame retardant particles are stably dispersed in an organic solvent over an extended period of time yet with no agglomeration.

For this reason, when the aforesaid surface treated flame retardant particles are used as a flame retardant in a varnish containing an insulation resin, a curing agent and a flame retardant, they are stably dispersed in the form of particles having a secondary particle diameter of up to 30 µm. As a result, it is possible to obtain a varnish capable of yielding an electrical insulation film that is improved in terms of flame retardancy, electrical insulation and resistance to high temperature-and-humidity conditions. This electrical insulation film is well fit for an electrical insulation layer on a circuit board, and may be used for multilayer circuit board preparation as well. Preferably, that varnish should be used to preform a formed material such as a film or sheet, which is then thermocompressed on a circuit board for curing, thereby forming an electrical insulation layer.

To prepare the surface treated flame retardant particles, the flame retardant is brought in contact with the aforesaid specific surface treatment agent in an organic solvent for surface treatment and, in the meantime, the flame retardant is wet milled, if required. Usually, the surface treated flame retardant particles are used in the form of a flame retardant slurry dispersed in an organic solvent. The surface treated flame retardant particles provide a flame retardant slurry that is stably dispersed in an organic solvent over an extended period of time.

Even when the varnish comprising a curable resin composition containing the surface treated flame retardant particles is stored for an extended period of time, it is less likely that coarse particles occur due to the agglomeration of flame retardant particles. An electrical insulation film obtained using this varnish stays stable even under high temperature-and-humidity conditions, giving no particulate deposits on the surface of the film. Such findings have underlain the present invention.

According to one aspect of the invention, there is thus provided a varnish comprising an insulation resin, a curing agent, a flame retardant and an organic solvent, wherein said flame retardant comprises flame retardant particles surface treated with at least one surface treatment agent selected from the group consisting of a phosphorus compound soluble in an organic solvent, an organosilicon compound and a dispersant having a carboxyl group.

According to another aspect of the invention, there is provided a formed material obtained by applying and drying a varnish on a substrate, wherein said varnish comprises (a) an insulation resin, (b) a curing agent, (c) flame retardant particles surface treated with at least one surface treatment agent selected from the group consisting of a phosphorus compound soluble in an organic solvent, an organosilicon compound and a dispersant having a carboxyl group, and (d) an organic solvent.

According to a further aspect of the invention, there is provided a multilayer structure wherein an electrical insulation layer obtained by curing a formed material comprising said varnish is formed on a substrate with a conductor circuit layer mounted thereon.

According to a further aspect of the invention, there is provided a process for the preparation of surface treated flame retardant particles, wherein a flame retardant is brought in contact with at least one surface treatment agent selected from the group consisting of a phosphorus compound soluble in an organic solvent, an organosilicon compound and a dispersant having a carboxyl group in an organic solvent for surface treatment, wherein said flame retardant is wet milled as needed.

According to a further aspect of the invention, there is provided a flame retardant slurry wherein flame retardant particles surface treated with at least one surface treatment agent selected from the group consisting of a phosphorus compound soluble in an organic solvent, an organosilicon compound and a dispersant having a carboxyl group are dispersed in an organic solvent.

According to a further aspect of the invention, there is provided a varnish preparation process comprising a step (1) of preparing surface treated flame retardant particles by bringing a flame retardant in contact with at least one surface treatment agent selected from the group consisting of a phosphorus compound soluble in an organic solvent, an organosilicon compound and a dispersant having a carboxyl group in an organic solvent for surface treatment, wherein said flame retardant is wet milled as needed, and a step (2) of mixing together a flame retardant slurry in which the surface treated flame retardant particles are dispersed in an organic solvent, an insulation resin and a curing agent, optionally followed by adding an organic solvent to the resulting mixture.

BEST MODE FOR CARRYING OUT THE INVENTION

The present invention provides a varnish comprising a curing resin composition comprising an insulation polymer, a curing agent, a flame retardant and an organic solvent. As the flame retardant in the invention, use is made of flame retardant particles surface treated with at least one surface treatment agent selected from the group consisting of a phosphorus compound soluble in an organic solvent, an organosilicon compound and a dispersant having a carboxyl group.

For the flame retardant, use is made of a flame retardant that is dispersible as solid particles in an organic solvent, and preferably a halogen-free flame retardant. The surface treated flame retardant particles may be obtained by bringing the flame retardant in contact with a specific treatment agent in an organic solvent for surface treatment, if required, with wet milling.

The surface treated flame retardant particles used in the present invention have a primary particle average major axis of preferably 0.01 to 5 µm, more preferably 0.05 to 3 µm, and an average aspect ratio (defined by average major axis/average minor axis) of preferably up to 5, more preferably up to 3. The surface treated flame retardant particles contain primary particles having a major axis of greater than 10 µm in preferably up to 10%, more preferably up to 5%, even more preferably up to 1% by number. Use of the thus finely dispersed surface treated flame retardant particles makes it possible to obtain a multilayer circuit board that is of high flame retardancy and is improved in electrical insulation as well. The surface treated flame retardant particles may have either a smooth surface or an irregular surface.

The surface treated flame retardant particles used herein are characterized in that they are less susceptible to secondary agglomeration in a varnish containing an insulation resin and a curing agent, and the secondary agglomeration, if any, would result in secondary particles having a small diameter. In other words, the secondary particle diameter of the surface treated flame retardant particles present in said varnish is preferably up to 30 µm, more preferably up to 25 µm, and even more preferably up to 20 µm. The secondary particle diameter is a value measured according to the JIK K-540 "Testing of Seeds, method A". Unless otherwise stated, the term "secondary particle diameter" used herein refers to a value measured by this method.

The proportion on a solid content basis of the surface treated flame retardant particles to be contained in the varnish is usually 0.1 to 80 parts by weight, preferably 1 to 60 parts by weight, more preferably 5 to 40 parts by weight per 100 parts by weight of the insulation resin, although varying depending on purpose.

The surface treated flame retardant particles used herein have been obtained by contact of the flame retardant with the surface treatment agent in an organic solvent. The contact of the surface treatment agent with the flame retardant allows the surface treatment agent to bond (or otherwise adsorb)

physically or chemically to the surface of the flame retardant, so that the cohesiveness of flame retardant particles can become low enough to ensure long-term dispersion stability.

How to bring the flame retardant in contact with the surface treatment agent is not critical to the practice of the invention. For instance, this may be achieved by (a) a method wherein while the flame retardant is dispersed in an organic solvent with addition of the surface treatment agent, they are brought in contact with each other, (b) a method wherein after the flame retardant is dispersed in an organic solvent, the surface treatment agent is added for contact with the flame retardant, and (c) a method wherein the flame retardant is dispersed in an organic solvent solution with the surface treatment agent previously contained therein for contact with the latter. In each of those surface treatment methods that are capable of making the secondary particle diameter of the flame retardant uniform and yielding a varnish having improved dispersion stability, wet milling is carried out under stirring conditions using a wet mill until the surface treated flame retardant particles have a secondary particle diameter of usually up to 30 am, preferably up to 25 μm, more preferably up to 20 μm. Preferably, the surface treatment is carried out in a solvent mixture containing a polar organic solvent and a non-polar organic solvent. Although not critical to the practice of the invention, the surface treatment is preferably carried out at a temperature that is lower than the boiling point of the solvents used.

For contact of the flame retardant with the surface treatment agent, different contact methods may be used in combination or the same contact method may be repeated at least twice. In the course of the surface treatment, a fresh surface treatment agent may be added dropwise to an organic solvent containing the flame retardant and the surface treatment agent.

(1) Flame Retardant

The flame retardant may be a compound so far known generally as a flame retardancy-imparting compound, and one requirement for it is that it is substantially insoluble in an organic solvent used for the preparation of surface treated flame retardant particles; it is present in the form of a solid in said organic solvent.

In view of protection of environments, it is preferable to use as the flame retardant a halogen-free flame retardancy-imparting agent that does not produce halogen-containing harmful substances upon incineration.

By way of illustration but not by way of limitation, the halogen-free flame retardant includes antimony compounds such as antimony trioxide, antimony pentoxide and sodium antimonite; other inorganic flame retardants such as aluminum hydroxide, magnesium hydroxide, zinc borate, guanidine sulfamate, zirconium compounds, molybdenum compounds and tin compounds; and phosphorus-containing compounds such as melamine polyphosphate (salt), melam polyphosphate (salt), melem polyphosphate (salt), melamine melam melem polyphosphate (complex salt), red phosphorus, guanidine phosphate, guanyl urea phosphate, polyphosphoric sulfate, ammonium polyphosphate, calcium adduct of nitrilotrismethylene phosphonate, magnesium adduct of nitrilotrismethylene phosphonate, phosphoric acid diphenyl ester-2-porpenylamide, phosphoric acid diphenyl ester-2-hydroxyethylamide, phosphoric acid diphenyl ester-di(2-hydroxyethyl)amide, phosphoric acid diphenyl ester-di-2-cyanoethylamide, phosphoric acid diphenyl ester-p-hydroxyphenylamide, phosphoric acid diphenyl ester-m-hydroxyphenylamide, phosphoric acid diphenyl ester-cyclohexylamide, phosphoric acid phenyl ester-di-N,N-phenylmethylamide, phosphoric acid phenyl ester-di-N-cyclohexylamide, di (butoxy) phosphinyipropyl-amide, and 1,3,5-triazine derivative salts of polyacids containing phosphorus, sulfur and oxygen (JP(A) 10-306082)

Among others, the phosphorus-containing compounds are preferred. For the phosophorus-containing compounds, preference is given to phosphorus-containing compounds comprising salts of basic nitrogenous compounds and phosphoric acid, more preference is given to melamine polyphosphate salts, melam polyphosphate salts, melem polyphosphate salts, malmine•melam•melem polyphosphate complex salts, etc., and most preference is given to melamine polyphosphate salts and melam polyphosphate salts. The melam polyphosphate salts are particularly preferred in that an electrical insulation film having improved resistance to high temperature-and-humidity conditions is easily obtainable.

Salts of basic nitrogenous compounds and phosphoric acids may generally be obtained by thermal condensation reaction of a phosphoric acid source with a nitrogen source in the presence of a condensation agent comprising urea or urea phosphate (that also serves as the phosphoric acid source) or their mixture, and then burning the reaction product. Commonly, ammonium orthophosphate, orthophosphoric acid, condensed phosphoric acid, phosphoric anhydride, urea phosphate, and ammonium monohydrogenphosphate or mixtures thereof are used for the phosphoric acid source, and melamine, dicyancyanamide, guanidine, guanyl urea or mixtures thereof are used for the nitrogen source.

Exemplary melam polyphosphate salts are a product obtained by burning an amide polyphosphate obtained by thermal condensation of 2,5,8-triamino-1,3,4,6,7,9,9b-heptaazaphenalene obtained by condensation of two melamine molecules with elimination of two ammonia molecules and the phosphoric acid, a product obtained by burning melamine orthophosphate, and a product obtained by burning a condensation product of the phosphoric acid source and melamine at high temperatures.

For the flame retardant, a particulate material that stays solid in an organic solvent is employed. Prior to contact with the surface treatment agent, the flame retardant has usually a median diameter of up to 10 μm, and is often present in an acicular or whisker form. In general, the flame retardant often contains 20% or more of primary particles having a major axis of greater than 10 μm, with an average major axis of the order of 10 to 20 μm. In such a case, it is preferable that the flame retardant in an acicular or whisker is wet milled in an organic solvent, preferably in a mixed solvent comprising a non-polar organic solvent and a polar organic solvent to regulate the aspect ratio of primary flame retardant particles to the aforesaid range.

When too much non-polar organic solvent is used in the mixed solvent, the salt of the nitrogenous compound and phosphoric acid is often less likely to have any desired shape due to agglomeration in the varnish during pulverization. Conversely, when too little non-polar organic solvent is used, the dispersion of the flame retardant into the insulation polymer may become worse due the likelihood of secondary agglomeration.

(2) Surface Treatment Agent

In the invention, at least one surface treatment agent selected from the group consisting of a phosphorus compound soluble in an organic solvent, an organosilicon compound and a dispersant having a carboxyl group is used as the surface treatment agent for the flame retardant.

<Phosphorus Compound Soluble in Organic Solvents>

The phosphorus compound used for contact with the flame retardant may be either an inorganic compound or an organic compound on condition that they are soluble in an organic solvent. In favor of satisfactory dispersibility, it is preferable to use an organic compound that does not contain any transition metal.

The wording "soluble in an organic solvent" here means that the phosphorus compound should be dissolved in the organic solvent used for the surface treatment in an amount of usually at least 0.1% by weight, preferably at least 0.5% by weight at 25° C. The amount of dissolution of the phosphorus compound could be ascertained by preparing an oversaturated solution, and making a quantitative analysis of a saturated solution obtained by filtering the oversaturated solution by means of gas chromatography or liquid chromatography.

Exemplary such phosphorus compounds are phosphorous compounds such as phosphate, phosphonite, phosphinite and phosphine; and pentavalent phosphorus compounds such as phosphate, phosphonate, phosphinate and phosphine oxide. Of these, the pentavalent phosphorus compounds, inter alia, phosphate are preferred in favor of solubility and stability in an organic solvent.

Exemplary phosphates are orthophosphoric acid ester, acidic phosphoric acid ester and thiophosphate. Exemplary orthophosphoric acid esters are trimethyl phosphate, tributyl phosphate, tri-2-ethylhexyl phosphate, tributoxyethyl phosphate, triphenyl phosphate, tricresyl phosphate, trixylenyl phosphate, cresyldiphenyl phosphate and 2-ethylhexyl-diphenyl phosphate.

Exemplary acidic phosphoric acid esters are methyl acid phosphate, isopropyl acid phosphate, butyl acid phosphate, 2-ethylhexyl acid phosphate, isodecyl acid phosphate, lauryl acid phosphate, stearyl acid phosphate, isostearyl acid phosphate, oleyl acid phosphate and di-2-ethylhexyl phosphate.

These acidic phosphoric acid esters may also take the form of amine salts such as an oleylamine salt of 2-ethylhexyl acid phosphate, a coconut amine salt of 2-ethylhexyl acid phosphate, and a tallow amine salt of 2-ethylhexyl acid phosphate.

Exemplary thiophosphates are trialkyl thiophosphate and di(2-ethylhexyl)dithiophosphate.

When the melamine polyphosphate salt is selected as the flame retardant, it is preferable to select an acidic phosphoric acid ester from the phosphorus compounds soluble in the organic solvent in consideration of dispersion stability of the flame retardant slurry. From the acidic phosphoric acid esters, it is preferable to select an alkyl acid phosphate having 8 or more carbon atoms such as isodecyl acid phosphate, lauryl acid phosphate, stearyl acid phosphate, isosteary acid phosphate, oleyl acid phosphate and di-2-ethylhexyl phosphate.

The phosphorus compounds soluble in the organic solvent may be used alone or in combination of two or more.

<Organosilicon Compound>

The organosilicon compound used for contact with the flame retardant is not particularly critical to the practice of the invention; for instance, organosilanes, organosilazanes and organosiloxanes may be used. Of these, the organosiloxanes are preferred because of low conductivity and improved dispersion stability, although organopolysiloxanes such as siloxane oligomers, silicone oils, silicone rubbers and silicone resins are most preferred.

Of the orgahopolysiloxanes, an organopolysiloxane having a functional group such as amino, epoxy, carboxyl, acrylate, methacrylate, hydroxide, mercapto, vinyl, and halogen group (halogen atom) is particularly preferred in favor of imparting high heat resistance to formed materials such as electrical insulation films. The organopoly-siloxanes are easily available on the market. When the melam polyphosphate salt is selected as the flame retardant, it is preferable to choose an organopoly-siloxane having a hydroxyl group as the functional group.

The organopolysiloxane used should have a viscosity at 23° C. (as measured by a B-type viscometer) of usually 0.01 to 2,000 centipoises, preferably 0.05 to 1,000 centipoises, more preferably 0.1 to 500 centipoises. An organic group that constitutes the organopolysiloxane is usually an alkyl group, an aryl group or the like. The aforesaid functional group may be bonded to these organic groups.

The organosilicon compounds may be used alone or in combination of two or more.

<Carboxyl Group-Containing Dispersant>

The carboxyl group-containing dispersant used for contact with the flame retardant is preferably a carboxyl group-containing compound used as a pigment dispersant. Exemplary such compounds include high-molecular dispersants with a carboxyl group bonded to an oligomer or polymer form of high-molecular compounds such as polyester resins, acrylic resins, polyurethane resins, polyether resins or alkyd resins as typically set forth in JP(A)9-183919.

Specifically but not exclusively, the high-molecular dispersant used has a viscosity at 23° C. (as measured by a B-type viscometer) of usually 100 to 20,000 centipoises, preferably 300 to 15,000 centipoises, more preferably 500 to 10,000 centipoises.

Specifically but not exclusively, the carboxyl group-containing dispersant has an acid number of usually 1 to 100 mgKOH/g and preferably 10 to 60 mgKOH/g.

When the melam polyphosphate salt is selected as the flame retardant, it is preferable to choose a carboxyl group-containing polyester resin out of the aforesaid dispersants in consideration of the dispersion stability of the flame retardant slurry.

The carboxyl group-containing polyester resin, for instance, may be obtained by the reaction at an elevated temperature of a compound having one carboxyl group with propiolactone, valerolactone, and caprolactone or a substituted derivative thereof using p-toluenesulfonic acid, dibutyltin laurate or the like as an initiator. Exemplary compounds having one carboxyl group include aliphatic monocarboxylic acids such as acetic acid, propionic acid, caprylic acid, nonanoic acid, capric acid, octylic acid, lauric acid, myristic acid, palmitic acid, stearic acid, isononanoic acid and arachic acid; and aromatic monocarboxylic acids such as benzoic acid and p-t-butylbenzoic acid. Polyester resins obtained by the condensation of glycol and dibasic acids in the presence of a compound having one carboxyl group, too, are usable as the carboxyl group-containing polyester resin.

The carboxyl group-containing dispersants may be used alone or in combination of two or more.

(3) Surface Treatment

The surface treatment agent should be used in an amount of usually 0.1 to 100 parts by weight, preferably 0.5 to 60 parts by weight more preferably 1 to 40 parts by weight per 100 parts of the flame retardant. Too little surface treatment agent renders it difficult to ensure satisfactory dispersion stability in the flame retardant slurry whereas too much causes the water absorption of the electrical insulation film to become high, often resulting in a drop of electrical insulation, and the mechanical properties of the film to become low, often leading to a break in the film.

The organic solvent used for the surface treatment may be either a non-polar organic solvent or a polar organic solvent, which may optionally be used in admixture. When the non-polar and polar organic solvents are used in admixture, the mixing ratio may be determined as desired, although the weight ratio of non-polar organic solvent to polar organic solvent is usually in the range of 5:95 to 95:5, preferably 10:90 to 90:10.

The non-polar organic solvent is a hydrocarbon compound having no polar group, as exemplified by aromatic hydrocarbons such as toluene, xylene, ethylbenzene and trimethylbenzene; and aliphatic hydrocarbons such as cyclopentane and cyclohexane, of which the aromatic hydrocarbons are preferred.

The polar organic solvent is an organic solvent having a polar group such as hydrogen (atom), carbonyl, carboxyl, hydroxyl, ester, amino and amide groups, as exemplified by halogenated hydrocarbon organic solvents such as chlorobenzene, dichlorobenzene and trichlorobenzene; and ketone organic solvents such as methyl ethyl ketone, methyl isobutyl ketone, cyclo-pentanone and cyclohexanone. Of these solvents, the ketone organic solvents are preferred.

As already described, the surface treatment may be carried out by bringing the flame retardant in contact with the surface treatment agent in the organic solvent, preferably in a solvent mixture of the non-polar and polar organic solvents, if required, with wet milling. The wet milling may be carried out using a wet mill.

(4) Flame Retardant Slurry

The flame retardant slurry of the invention is a slurry in which the surface treated flame retardant particles obtained by contact of the flame retardant with the surface treatment agent are dispersed in an organic solvent. The flame retardant slurry may be (a) a slurry after the surface treatment and before removal of the organic solvent, (b) a slurry obtained by the addition of the organic solvent to the slurry (a), (c) a slurry obtained by removal of a part of the organic solvent from the flame retardant slurry (a), and (d) a newly prepared slurry obtained by the surface treatment, removal of the organic solvent to obtain dried, surface treated flame retardant particles, and mixing those particles with the organic solvent.

The flame retardant slurry may be obtained using the same non-polar and/or polar organic solvents as mentioned above. No particular limitation is placed on how to mix the surface treated flame retardant particles or the slurry containing them with the organic solvent; for instance, mixing may be carried out using a stirrer having a stirring blade, a wet dispersing machine or the like.

In the flame retardant slurry of the invention, the surface treated flame retardant particles are dispersed in the organic solvent in a particulate form having a secondary particle diameter of usually up to 30 μm, preferably up to 25 μm, more preferably up to 20 μm. Such a flame retardant slurry has the feature of containing less secondary agglomeration particles, and that feature is carried over to the varnish of the invention prepared using the flame retardant slurry.

The flame retardant slurry has a solid content in such a range as to contain the desired amount of the surface treated flame retardant particles, and that solid content is usually selected from the range of 5 to 90% by weight. In view of workability, the flame retardant slurry preferably has a viscosity of up to 100 Pa·s.

For the purpose of enhancing the shelf stability of the flame retardant slurry, it is acceptable to bring it in contact with inorganic porous substances such as silica gel, diatomaceous earth, activated alumina, magnesia, titania, silica-alumina, zeolite, molecular sieve, porous silicon, porous glass beads, activated clay, mica, kaolin, magnetite, ferrite and nickel oxide; and organic porous substances such as activated charcoal, molecular sieving carbon and ion exchange resins.

If required, the surface treated flame retardant particles may be isolated from the flame retardant slurry by removal of the organic solvent, and drying. By way of illustration but not by way of limitation, the flame retardant slurry may be previously separated as by a filter cloth into surface treated flame retardant particles and an organic solvent, followed by drying. By way of illustration but not exclusively, drying may be carried out at a temperature at which the flame retardant does not decompose and the organic solvent volatilizes off. Any desired drying equipment such as a one-pass or inert oven may be used, provided that it has a means for prevention of a possible dust explosion of flame retardants.

(5) Insulation Resins

Not by way of limitation, the insulation resin used for the varnish of the invention should be an electrical insulation resin as exemplified by epoxy resins, maleimide resins, (meth)acrylic resins, diallyl phthalate resins, triazine resins, alicyclic olefin polymers, aromatic polyether polymers, benzocyclobutene polymers, cyanate ester polymers, liquid crystal polymers and polyimide resins.

Of these, preference is given to alicyclic olefin polymers, aromatic polyether polymers, benzocyclobutene polymers, cyanate ester polymers and polyimide resins, with the alicyclic olefine polymers and aromatic polyether polymers being more preferred and the alicyclic olefin polymers being most preferred.

The alicyclic olefin polymers should preferably have polar groups as exemplified by hydroxyl, carboxyl, alkoxyl, epoxy, glycidyl, oxycarbonyl, carbonyl, amino, ester and carboxylic anhydride groups, and particular preference is given to carboxyl and carboxylic anhydride groups.

Alicyclic olefin polymers, for instance, include (i) ring-opening polymers of monomers having a norbornene ring such as 8-ethyl-tetracyclo[4.4.0.1$^{2,5}$.1$^{7,10}$]dodeca-3-ene (i.e., norbornene monomers) and their hydrogenated products, (ii) addition polymers of norbornene monomers, (iii) addition polymers of norbornene monomers and vinyl compounds, (iv) monocyclic cycloalkene polymers, (v) alicyclic conjugated diene polymers, (vi) vinylic alicyclic hydrocarbon polymers and their hydrogenated products, and (vii) products obtained by hydrogenation of aromatic ring moieties of aromatic olefin polymers.

Of these, preference is given to the ring-opening polymers of norbornene monomers and their hydrogenated products, the addition polymers of norbornene monomer and vinyl compounds and the products obtained by the hydrogenation of the aromatic ring moieties of aromatic olefin polymers, although the hydrogenated products of the polymers obtained by the ring-opening polymerization of norbornene monomers are most preferred.

The norbornene monomers, for instance, include those called norbornenes in the common name, dicyclopentadienes and tetracyclododecenes. Not by way of limitation, the polymerization of the alicyclic olefins and aromatic olefins as well as optional hydrogenation should be carried out according to known manners.

No particular limitation is placed on the weight-average molecular weight (Mw) of the insulation resin. The insulation resin, when it is an insulation polymer such as an alicyclic olefin polymer, should have a weight-average molecular weight of preferably 10,000 to 1,000,000, more preferably 30,000 to 700,000 and even more preferably 50,000 to 500,000. The weight-average molecular weight is measured by gel permeation chromatography (GPC), and expressed on a polystyrene or polyisopurene basis.

These alicyclic olefin polymers may be used alone or in combination of two or more.

Although varying on purpose, the alicyclic olefin polymer should have a glass transition temperature of usually 50° C. or higher, preferably 70° C. or higher, more preferably 100° C. or higher, and most preferably 125° C. or higher.

(6) Curing Agent

Specifically but not exclusively, the curing agent used herein is an ionic curing agent, a radical curing agent, and a combined ionic and radical curing agent.

More specifically, the curing agent includes nitrogen based curing agents exemplified by isocyanurate curing agents containing an allyl group and an epoxy group but being free from halogen such as 1-allyl-3,5-diglycidyl isocyanurate and 1,3-diallyl-5-glycidyl isocyanurate; glycidyl ether type epoxy compounds exemplified by bisphenol A glycidyl ether epoxy type compounds such as bisphenol A bis(ethylene glycol glycidyl ether)ether, bisphenol A bis(diethylene glycol glycidyl ether)ether, bisphenol A bis(triethylene glycol glycidyl ether)ether and bisphenol A bis(propylene glycol glycidyl ether)ether; polyvalent epoxyl compounds such as alicyclic epoxy compounds and glycicyl ester type epoxy compounds; dicarboxylic acid derivatives such as acid anhydrides and carboxylic acids; and polyol compounds such as diol compounds, triol compounds and polyvalent phenol compounds.

Of these curing agents, preference is given to the polyvalent epoxy compounds, and especially with improvements in crack resistance of electrical insulation films in mind, the glycidyl ether type epoxy compounds is particularly preferred. Although varying with the type of insulation resin and the type of curing agent, the curing agent is used in an amount of usually 1 to 100 parts by weight, preferably 5 to 80 parts by weight, more preferably 10 to 50 parts by weight per 100 parts by weight of insulation resin.

(7) Curing Accelerator and Curing Aid

To promote a curing reaction between the insulation resin such as an alicyclic olefin polymer and the curing agent, curing accelerators or curing aids may be used. For instance, when the curing agent is a polyvalent epoxy compound, tertiary amine compounds or boron trifluoride complex compounds are preferred for that curing accelerator. Of these, it is preferable to use the tertiary amine compounds because of improvements in lamination capability to finer interconnecting lines (finer conductor circuits), insulation resistance, heat resistance and chemical resistance.

The curing agents may be used alone or in combination of two or more. Although properly determined on purpose, the curing agent(s) should be used in an amount of usually 0.001 to 30 parts by weight, preferably 0.01 to 10 parts by weight, more preferably 0.03 to 5 parts by weight per 100 parts by weight of insulation resin.

The curing aids used herein, for instance, are based on oxime-nitroso compounds, maleimide compounds, allyl compounds, methacrylate compounds, vinyl compounds and tertiary amine compounds. In addition, peroxides functioning as curing aids may be used for an allyl group-containing curing agent. The curing aid or aids may be used optionally in suitable amounts.

(8) Other Components

In addition to the above components and as desired, the varnish of the invention may contain as the other components flexible polymers, heat stabilizers, weathering stabilizers, aging preventives, leveling agents, antistatic agents, slip agents, antiblocking agents, antifog agent, lubricants, dyes, pigments, natural oils, synthetic oils, waxes, emulsifying agents, fillers, ultraviolet absorbers and so on.

(9) Varnish

The varnish of the invention may be obtained by mixing the insulation resin, the curing agent, the flame retardant (surface-treated flame retardant particles), the curing aid added if required, and the other components together with the organic solvent.

The organic solvent is used in an amount good enough to dissolve or disperse the respective components like the insulation resin uniformly therein. While the amount of the organic solvent to be used is properly determined in consideration of thickness control of the electrical insulation film to be formed and its flatness, the organic solvent is used in such an amount that the varnish has a solid content of usually 5 to 70% by weight, preferably 10 to 65% by weight, more preferably 20 to 60% by weight. When the varnish is prepared using the flame retardant slurry and the amount of the organic solvent contained in the flame retardant slurry is often insufficient, a fresh organic solvent may be added at the time of varnish preparation.

No particular limitation is placed on how to obtain the varnish; however, it is preferable that the respective components are mixed together at a temperature at which the curing reaction by the curing agent has no adverse influence on workability, and for safety purposes, it is more preferable that mixing is carried out at a temperature lower than the boiling temperature of the organic solvent used for that mixing.

The organic solvent used to this end, for instance, includes aromatic hydrocarbon organic solvents such as toluene, xylene, ethylbenzene and trimethylbenzene; aliphatic hydrocarbon organic solvents such as n-pentane, n-hexane and n-heptane; alicyclic hydrocarbon organic solvents such as cyclopentane and cyclohexane; halogenated hydrocarbon organic solvents such as chlorobenzene, dichlorobenzene and trichlorobenzene; and ketone organic solvents such as methyl ethyl ketone, methyl isobutyl ketone, cyclopentanone and cyclohexanone. These organic solvents may be used alone or in combination of two or more.

Of these organic solvents, it is preferable to use a solvent mixture of a non-polar organic solvent such as an aromatic hydrocarbon organic solvent or an alicyclic hydrocarbon organic solvent with a polar organic solvent such as a ketone organic solvent, because it can provide a sheet or film formed material that is well embedded in finer interconnecting lines with no gas bubble during formation of an electrical insulation film on a circuit board. Although properly determined, the non-polar and polar organic solvents should be used at a weight ratio of usually 5:95 to 95:5, preferably 10:90 to 90:10, more preferably 20:80 to 80:20.

The respective components may be mixed together in known manners; for instance, mixing may be carried out by means of agitation relying on a combined stirring bar and magnetic stirrer or methods using a high-speed homogenizer, dispersion, a planetary stirring machine, a biaxial stirring machine, a ball mill, a three-roll machine or the like.

(10) Formed Material

The formed material of the invention is obtained by applying the varnish of the invention on a substrate of any desired shape, followed by drying. For instance, the inventive varnish may be applied and dried on a flat substrate such as a resin film (carrier film) or a metal foil to obtain sheet or film formed material.

No particular limitation is placed on how to obtain the sheet or film formed material; however, it is preferable to rely on solution or melt casting in view of workability. The solution casting involves coating of varnish on the substrate, and then removal of the organic solvent by drying.

For the substrate used for solution casting, resin films (carrier films), metal foils or the like are used. Usually, thermoplastic resin films are used for the resin film. More specifically, polyethylene terephthalate films, polypropylene films, polyethylene films, polycarbonate films, polyethylene naphthalate films, polyallylate films and nylon films are used. Of these films, preference is given to the polyethylene terephthalate, and polyethylene naphthalate films in view of heat resistance, chemical resistance, releasability and so on.

For the metal foil, for instance, copper foils, aluminum foils, nickel foils, chromium foils, gold foils and silver foils are mentioned. In view of good conductivity and inexpensiveness, copper foils, especially electrolytic, and rolled copper foils are preferred. Although not critical to the practice of the invention, the substrate should have a thickness of usually 1 to 150 µm, preferably 2 to 100 µm, more preferably 3 to 50 µm in view of workability, etc.

The varnish may be coated on the substrate by various coating methods inclusive of dip coating, roll coating, curtain coating, die coating and slit coating, and the conditions for organic solvent removal may be chosen from various conditions depending on the type of the organic solvent used. Drying temperature is usually 20 to 300° C., preferably 30 to 200° C., and drying time is usually 30 seconds to 1 hour, preferably 1 to 30 minutes.

Film or sheet thickness is usually 0.1 to 150 µm, preferably 0.5 to 100 µm, more preferably 1.0 to 80 µm. When it is desired to obtain a film or sheet by itself, the film or sheet is released from the substrate on which it has been formed.

The varnish of the invention could be used to form a prepreg by impregnation in fiber materials such as organic synthetic fibers or glass fibers.

(11) Electrical Insulation Film and Multilayer Structure

The electrical insulation film of the invention is a cured product that is obtained by curing a formed material obtained by coating and drying of the inventive varnish on a substrate. A multilayer structure is obtained by coating, drying and curing of the inventive varnish on any desired substrate. For that substrate, usually, a substrate with a conductor circuit layer formed thereon is used.

A typical substrate having a conductive circuit layer thereon is an internal layer substrate comprising an electrical insulation layer (1) such as a printed wiring substrate or a silicon wafer substrate and a conductor circuit layer (a) formed on the surface of that layer. The internal layer has a thickness of usually 50 µm to 2 mm, preferably 60 µm to 1.6 mm, more preferably 100 µm to 1 mm.

Specifically but not exclusively, the electrical insulation layer (1) that constitutes a part of the internal layer substrate may be formed of any desired material of electrical insulation. For instance, an electrical insulation film obtained by curing the aforesaid varnish may be mentioned. For the purpose of strength improvements, the internal layer substrate may contain glass fibers, resin fibers or the like. The conductor circuit layer (a) that constitutes another part of the internal layer substrate is usually made of an electrically conductive metal such as copper.

How to obtain a multilayer structure having the electrical insulation layer of the invention involves (A) a method that comprises steps of coating a substrate having a conductor circuit layer with the varnish of the invention, then removing the organic solvent from the coated film and drying the coated film to form a coating, and finally curing the coating by means of heating or irradiation with light into an electrical insulation layer, and (B) a method that comprises steps of superposing a film or sheet formed material on a substrate having a conductor circuit layer, and then curing the film or sheet by means of thermocompression or the like. However, it is preferable to make use of the method (B) using a film or sheet in an uncured or semi-cured state, because it ensures that the resulting electrical insulation layer can have smoothness and makes the formation of a multilayer structure easy.

In a 500 µm$^2$ area, as checked up by a scanning electron microscope, of the electrical insulation film of the invention, there is no bulky particle formed by agglomeration of flame retardant particles with a particle size in excess of usually 30 µm, preferably 25 µm, and preferably 20 µm.

The electrical insulation film of the invention has a thickness of usually 0.1 to 200 µm, preferably 1 to 150 µm, more preferably 10 to 100 µm.

No particular limitation is imposed on how to carry out the aforesaid method (A) for coating the internal layer substrate with the inventive varnish; for instance, the inventive varnish may be applied on the internal layer substrate by means of a die coater, a roll coater or a curtain coater. After the varnish has been coated on the substrate, the assembly is dried at usually 70 to 140° C. for 1 to 30 minutes. Then, the assembly is cured by heating at usually 30 to 400° C., preferably 70 to 300° C., preferably 100 to 200° C. for usually 0.1 to 5 hours, preferably 0.5 to 3 hours. In this way, a multilayer structure with the inventive electrical insulation film (electrical insulation layer) formed thereon may be obtained.

When a film or sheet formed material is laminated on a substrate by means of the aforesaid method (B), usually, the film or sheet formed material provided on a carrier is placed on the internal layer substrate while in contact with its surface. Then, a pressurizing machine such as a pressurizing laminator, a vacuum laminator, a vacuum press or a roll laminator is used for thermocompression of the assembly. Preferably, the thermocompression should be performed in vacuo so as to improve the ability of the formed material to be embedded in interconnecting lines and hold back gas bubbles, etc. The thermocompression is carried out at a temperature of usually 30 to 250° C., preferably 70 to 200° C. and a compression pressure of usually 10 kPa to 20 MPa, preferably 100 kPa to 10 MPa for usually 30 seconds to 5 hours, preferably 1 minute to 3 hours. During the thermocompression, the thermocompression atmosphere should desirously be reduced down to usually 100 kPa to 1 Pa, preferably 40 kPa to 10 Pa.

After the thermocompression, the assembly is cured as described above to obtain a multilayer structure of the invention with the inventive electrical insulation film (electrical insulation layer) formed thereon. When the film or sheet formed material with the carrier is laminated on the substrate, usually, curing should be carried out after removal of that carrier, although it is acceptable to cure the film or sheet formed material while the carrier stays attached thereto.

To enhance the adhesion force between the internal layer substrate and the second electrical insulation layer (2) formed thereon, it is preferable to pre-treat the internal layer substrate by means of, for instance, a pretreatment method wherein an aqueous solution of alkaline sodium chlorite, magnesium permanganate or the like is brought in contact with the surface of the internal layer substrate to make that surface coarse; a pretreatment method wherein the surface of the internal layer substrate is oxidized by an aqueous solution of alkaline potassium persulfate, an aqueous solution of potassium sulfide-ammonium chloride or the like, followed by reduction; a pretreatment method wherein the conductor circuit portion of the internal layer substrate is plated for deposition; and a pretreatment method wherein a primer layer is formed for the internal layer substrate, using a triazine thiol compound, a silane compound or the like.

Of these methods, preference is given to the pretreatment method wherein the primer layer is formed for the internal layer substrate using the triazine thiol compound such as 2-di-n-butylamino-4,6-dimercapto-s-triazine, because when the conductor circuit is formed of copper, much stronger adhesion force is ensured by reason of no corrosion of copper.

In this way, the multilayer structure with the second electrical insulation film (electrical insulation layer (2)) formed thereon is obtained.

When this multilayer structure is obtained in the form of the end circuit board, the inventive electrical insulation layer (electrical insulation film (2)) functions as a solder resist in that board.

If the inventive multilayer structure is used as an additional internal layer substrate and a new conductor circuit is formed on the second electrical insulation layer (2), it is then possible to obtain a multilayer circuit board having a structure wherein conductor circuit layers and electrical insulation layers are alternately placed one upon another. Thus, this multilayer circuit board, too, is a multilayer structure according to the invention. Specifically but not exclusively, the multilayer circuit board is prepared by the following process.

A via hole-formation opening is provided in the electrical insulation layer (2). A metal thin film is formed on the surface of the electrical insulation layer (2) and the surface of the inside wall of the via hole-formation opening by means of dry processes (dry plating) such as sputtering. Then, a plating resist is formed on the metal thin film, followed by formation of a plating film thereon by means of wet plating such as electrolytic plating. After removal of the plating resist, a second conductor circuit (b) made up of a metal thin film and an electrolytic plating film is formed by etching. To enhance the adhesive force between the electrical insulation layer (2) and the conductor circuit (b), it is acceptable to bring a liquid such as permanganic acid or chromic acid in contact with the surface of the electrical insulation layer (2) or subject that surface to a plasma treatment.

No particular limitation is placed on how to provide through the electrical insulation layer (2) the via hole-formation opening for making a connection between the conductor circuits (a) and (b); for instance, some physical treatment means such as drilling, laser or plasma etching may be used. However, it is preferable to rely on a laser process using carbon dioxide gas laser, excimer laser or UV-YAG laser, because much finer via holes can be formed without any decrease in the properties of the electrical insulation layer.

In the aforesaid circuit board, a part of the conductor circuits may take the form of a metal power source layer, a metal ground layer, a metal shield layer or the like.

The multilayer circuit board of the invention may be used as a printed wiring board for mounting of semiconductor devices such as CPUs or memories and other mounting components in computers, cellular phones or many other electronics. In particular, a multilayer circuit board having finer interconnecting lines is well fit for a high-density printed wiring board for high-speed computers, portable terminals used in high-frequency applications, etc.

EXAMPLES

The present invention is now specifically explained with reference to inventive and comparative examples, in which unless otherwise stated, the "part" and "%" are given on a mass basis.

First of all, how to make estimations in the following examples is explained.

(1) Average Major Axis of Primary Particle

Major axes of 1,000 particles were measured under a scanning electron microscope to define the average value of the obtained measurements as the average major axis value of primary particles.

(2) Average Aspect Ratio

Major and minor axes of 1,000 particles were measured under a scanning electron microscope, and the average value of the obtained measurements was applied to the following equation to find the aspect ratio.

Aspect Ratio=(average of major axis)/(average of minor axis)

(3) Estimation of Secondary Particle Diameter

The secondary particle diameter of the flame retardant particles in the varnish was measured by the JIS K-5400 "Testing of Seeds, Method A". Four or forty-eight hours after varnish blending, the particles were measured for the secondary particle diameter, and the results were estimated on the following ranks:

Rank A indicates that particles of greater than 20 μm in size were not found;

Rank B indicates that particles of greater than 20 μm to less than 30 μm in size were found; and Rank C indicates that particles of greater than 30 μm were found.

(4) Estimation of Flame Retardancy

A multilayer circuit board sample was prepared, in which three electrical insulation layers (prepared using a varnish obtained 4 or 48 hours after varnish blending) were laminated on each side of an internal layer substrate; six electrical insulation layers in all. A conductor circuit-free area of the sample was cut into a strip of 13 mm in width and 100 mm in length to make a test piece. The obtained test piece was subjected to a 10-second exposure to a flame—adjusted to a height of 19 mm—belching out of a Bunsen burner comprising a tube of 9.5 mm in opening diameter and 100 mm in length wherein methane gas was burned. Just after the lapse of 10 seconds, the test piece was pulled apart from the flame to measure how long it burned. Immediately after any flame was not found in the test piece, it was again exposed to the flame for 10 seconds. Just after the lapse of 10 seconds, the test piece was again pulled apart from the flame to measure how long it burned. Flame retardancy was estimated from the total of the first burning time and the second burning time on the following ranks:

Rank A indicates that the total burning time is not longer than 5 seconds;

Rank B indicates that the total burning time is in the range of longer than 5 seconds to not longer than 10 seconds; and Rank C indicates that the total burning time is longer than 10 seconds.

(5) Estimation of Interlayer Insulation Resistance

A multilayer circuit board sample was prepared, in which three electrical insulation layers (a varnish after the estimation of secondary particle diameter and resistance to high temperature-and-humidity) were formed on each side of an internal layer substrate; six electrical insulation layers in all. Between the second and the third electrical insulation layer of the obtained multilayer board, a pattern was solid printed according to JPCA-BU01 to form a pattern for estimation of a conductor-line arrangement. Then, the board sample was allowed to stand alone in a thermohygrostat bath kept at 131° C. and 85% RH (relative humidity). One hundred hours later, the multilayer circuit board sample to be estimated was allowed to stand alone in a normal state (25° C., 50% RH) and after a further 1 hour, the electrical insulation resistance value between the solid printed conductor and the line was measured in the normal state (25° C., 50% RH) at an applied DC voltage of 5.5 V. The interlayer insulation resistance was estimated from the electrical insulation resistance value on the following ranks:

Rank A is indicative of $10^9$ Ω or greater;

Rank B is indicative of at least $10^8$ Ω to less than $10^9$ Ω;

Rank C shows that no short circuit occurred at less than $10^8$ Ω; and

Rank D shows that there was a short circuit at less than $10^8$ Ω.

(6) Estimation of Resistance to High Temperature-and-Humidity

A varnish 4 hours after varnish blending was used to obtain a formed material. This formed material was cured to provide three electrical insulation layers on each side of an internal layer substrate, thereby obtaining a multilayer circuit board sample having a total of six insulation layers. The board sample was allowed to stand alone in a thermohygrostat bath kept at 121° C. and 100% RH (in an unsaturated mode). Ninety-six hours later, the board sample for estimation was taken out of the bath, and the appearance of a conductor layer-free area of the board sample was inspected under an optical microscope. Estimation was made on the following ranks:

Rank A indicates that no particulate deposits were found on the electrical insulation layer on the surface of the board sample;

Rank B indicates that particulate deposits of less than 1 μm were found on the surface of the board sample; and Rank C indicates that particulate deposits of 1 μm or greater were found on the surface of the board sample.

Preparation Example 1

Preparation of Surface-Treated, Finely Divided Melamine Polyphosphate Salt Slurry A Three hundred (300) parts of melamine polyphosphate salt having primary particles having the particles with a major axis of greater than 10 μm in 55%, an average major axis of 17 μm and an aspect ratio of 13, 379 parts of xylene, 253 parts of cyclopentanone and 75 parts of oleyl acid phosphate were circulated and subjected to pulverization for 120 minutes under a residence time condition of 18 minutes in a horizontal media agitating mill (Dyno-Mill made by Shinmaru Enterprises Co., Ltd.) filled with 83% by volume of 0.4-mm zirconia beads.

After the pulverization, 30 parts of oleyl acid phosphate, 160 parts of xylene and 107 parts of cyclopentanone were added to the resulting slurry to obtain a slurry A having a solid concentration of 23% by weight. After drying, the slurry A was found that the primary particles had the particles with a major axis of greater than 10 μm in 0.1%, an average major axis of 1.1 μm and an aspect ratio of 1.4, as observed under a scanning microscope.

Preparation Example 2

Preparation of Surface-Treated, Finely Divided Melam Polyphosphate Salt Slurry B Three hundred (300) parts of melam polyphosphate salt having primary particles having the particles with a major axis of greater than 10 μm in 55%, an average major axis of 17 μm and an aspect ratio of 13, 64 parts of xylene, 568 parts of cyclopentanone and 75 parts of oleyl acid phosphate were circulated and subjected to pulverization for 120 minutes under a residence time condition of 18 minutes in the horizontal media agitating mill filled with 83% by volume of 0.4-mm zirconia beads.

After the pulverization, 30 parts of oleyl acid phosphate, 27 parts of xylene and 240 parts of cyclopentanone were added to the resulting slurry to obtain a slurry B having a solid concentration of 23% by weight. After drying, the slurry B was found that the primary particles had the particles with a major axis of greater than 10 μm in 0.1%, an average major axis of 1.1 μm and an aspect ratio of 1.4, as observed under a scanning microscope.

Preparation Example 3

Preparation of Finely Divided Melamine Polyphosphate Salt Slurry C

Three hundred (300) parts of melamine polyphosphate salt having primary particles having the particles with a major axis of greater than 10 μm in 55%, an average major axis of 17 μm and an aspect ratio of 13, 1,020 parts of xylene and 680 parts of cyclopentanone were stirred in a separable flask using a stirrer having three stirring blades to obtain 15% by weight of a melamine polyphosphate salt slurry.

Two thousand (2,000) parts of the resultant slurry were circulated and pulverized for 120 minutes under a residence time condition of 18 minutes in the horizontal media agitating mill filled with 83% by volume of 0.4-mm zirconia bead to obtain a slurry C. After drying, the slurry C was found that the primary particles had the particles with a major axis of greater than 10 μm in 0.5%, an average major axis of 1.3 μm and an aspect ratio of 1.6, as observed under a scanning microscope.

Preparation Example 4

Preparation of Surface-Treated, Finely Divided Melam Polyphosphate Salt Slurry D Three hundred (300) parts of melam polyphosphate salt having primary particles having the particles with a major axis of greater than 10 μm in 55%, an average major axis of 17 µm and an aspect ratio of 13, 72 parts of xylene, 649 parts of cyclopentanone and 9 parts of a carboxyl group-containing high-molecular dispersant (Agispur PA111 made by Ajinomoto Fine Techno Co., Ltd. with an acid number of 35 mgKOH/g and a viscosity of 4,000 poises) were circulated and subjected to pulverization for 60 minutes under a residence time condition of 18 minutes in a horizontal media agitating mill (Dyno-Mill made by Shinmaru Enterprises Co., Ltd.) filled with 83% by volume of 0.4-mm zirconia beads. Sixty minutes later, the resultant slurry, to which 9 parts by Agispur PA111, 2 parts of xylene and 19 parts of cyclopentanone were added, was circulated and subjected to pulverization for 60 minutes under a residence time condition of 18 minutes.

After the pulverization, 44 parts of xylene and 396 parts of cyclopentanone were added to the resulting slurry to obtain a slurry D having a solid concentration of 20% by weight. After drying, the slurry D was found that the primary particles had the particles with a major axis of greater than 10 µm in 0.1%, an average major axis of 1.1 µm and an aspect ratio of 1.4, as observed under a scanning microscope.

Preparation Example 5

Preparation of Surface-Treated, Finely Divided Melam Polyphosphate Salt Slurry E Three hundred (300) parts of melam polyphosphate salt having primary particles having the particles with a major axis of greater than 10 µm in 55%, an average major axis of 17 µm and an aspect ratio of 13, 76 parts of xylene, 645 parts of cyclopentanone and 9 parts of a hydroxyl group-containing organopolysiloxane (TSR175 made by GE Toshiba Silicones Co., Ltd.) were circulated and subjected to pulverization for 60 minutes under a residence time condition of 18 minutes in the horizontal media agitating mill filled with 83% by volume of 0.4-mm zirconia beads.

After the pulverization, 9 parts of the organopolysiloxane, 6 parts of xylene and 15 parts of cyclopentanone were added to the resulting slurry, which was in turn circulated and subjected to pulverization for 60 minutes under a residence time condition of 18 minutes. After the pulverization, 44 parts of xylene and 396 parts of cyclopentanone were added to the resultant slurry to obtain a slurry E having a solid concentration of 20% by weight. After drying, the slurry E was found that the primary particles had the particles with a major axis of greater than 10 µm in 0.1%, an average major axis of 1.1 µm and an aspect ratio of 1.4, as observed under a scanning microscope.

Preparation Example 6

Preparation of Finely Divided Melam Polyphosphate Salt Slurry F

Three hundred (300) parts of melam polyphosphate salt having primary particles having the particles with a major axis of greater than 10 µm in 55%, an average major axis of 17 µm and an aspect ratio of 13, 70 parts of xylene and 630 parts of cyclopentanone were circulated and subjected to pulverization for 60 minutes under a residence time condition of 18 minutes in the horizontal media agitating mill filled with 83% by volume of 0.4-mm zirconia beads.

After the pulverization, 50 parts of xylene and 450 parts of cyclopentanone were added to the resultant slurry to obtain a slurry F having a solid concentration of 20% by weight. After drying, the slurry F was found that the primary particles had the particles with a major axis of greater than 10 µm in 0.5%, an average major axis of 1.3 µm and an aspect ratio of 1.6, as observed under a scanning microscope.

Example 1

After hydrogenation of a ring-opening polymer of 8-ethyl-tetracyclo [$4.4.0.1^{2,5}.1^{7,10}$]dodeca-3-ene, maleic anhydride was subjected to a graft reaction with the hydrogenated product to obtain an alicyclic olefin polymer having a number-average molecular weight of Mn=33,200, a weight-average molecular weight of Mw=68,300, a glass transition temperature of Tg=170° C. and a maleic acid residue content of 25 mol %.

One hundred (100) parts of that alicyclic olefin polymer, 37.5 parts of bisphenol A bis(propylene glycol glycidyl ether)ether, 12.5 parts of 1,3-diallyl-5-[2-hydroxy-3-phenyloxypropyl]isocyanurate, 6 parts of dicumyl peroxide, 0.1 part of 1-benzyl-2-phenylimidazole, 5 parts of 2-[2-hydroxy-3,5-bis(α,α-dimethylbenzyl)phenyl] benzotriazole and 130 parts of the flame retardant slurry A obtained in Preparation Example 1 were dissolved in a solvent mixture made up of 170 parts of xylene and 42 parts of cyclopentanone to obtain a varnish. This varnish was estimated for its secondary particle diameter after allowed to stand alone for 4 hours and 48 hours in the normal state, respectively. The results are reported in Table 1.

The varnish used for the estimation of the secondary particle diameter, allowed to stand alone for 4 hours, and 48 hours in the normal state, was applied to a polyethylene naphthalate film of 300 mm square and 50 µm in thickness, and dried at 120° C. for 10 minutes in a nitrogen-prevailing oven, thereby obtaining a dry film with a carrier, wherein the resin formed material had a thickness of 40 µm.

Apart from this, a 0.1% by weight isopropyl alcohol solution of 2-dibutylamino-4,6-s-triazine was prepared. A 0.8-mm thick double-sided copper-clad substrate (a core material that was obtained by impregnating a glass cloth with a varnish containing glass filler and a halogen-free epoxy resin and had copper claddings on both sides) provided with an internal layer circuit having a line width of 50 µm, an interline distance of 50 µm and a conductor thickness of 18 µm and micro-etched on its surface was dipped in that solution at 25° C. for 1 minute, and then dried at 90° C. for 15 minutes in a nitrogen-substituted oven to form a primer layer, thereby obtaining an internal layer substrate.

The aforesaid dry films each with a carrier film were superposed at their resin surfaces on both sides of the double-sided copper-clad substrate of the internal layer substrate. Then, primary pressing was applied to the resultant assembly at a reduced pressure of 200 Pa in a vacuum laminator machine having upper and lower heat-resistant rubber press plates; a 60-second thermo-compression was carried out at a temperature of 110° C. and a pressure of 1.0 MPa. Subsequently, secondary pressing was applied to the assembly at a reduced pressure of 200 Pa in a vacuum laminator machine having upper and lower heat-resistant rubber press plates each covered with a metallic press plate; a 60-second thermocompression was performed at a temperature of 140° C. and a pressure of 1.0 MPa. After this, only the polyethylene naphthalate film was peeled off, and the assembly was allowed to stand alone at 140° C. for 30 minutes, and then at 170° C. for 60 minutes in a nitrogen-prevailing oven to form an electrical insulation layer on the internal layer substrate.

Using the third harmonic of UV-YAG laser, an interlayer-connection via hole of 30 μm in diameter was formed through an insulation layer portion of the obtained multilayer substrate. The multilayer substrate with the via hole formed through it was exposed to an argon plasma of 13.56 MHz in frequency, 100 W in output and 0.8 Pa in gas pressure for 10 minutes while the surface of the multilayer substrate was kept at a temperature of about 130° C.

Next, the thus plasma treated circuit substrate was nickel sputtered at an output of 500 W and a gas pressure of 0.8 Pa to form a nickel film of 0.1 μm in thickness, and then copper sputtered at an output of 500 W and a gas pressure of 0.8 Pa to form a copper thin film of 0.3 μm in thickness, thereby obtaining a multilayer substrate having metal thin films.

A commercially available photosensitive dry film was bonded by thermocompression to the surface of the multilayer substrate. After a given pattern mask was in close contact with the dry film for exposure, development was carried out to obtain a resist pattern. Then, electrolytic copper plating was applied to a resist pattern-free area to form an electrolytic copper plating film of 18 μm in thickness. Subsequently, the resist pattern was stripped off with a stripper and etching was carried out using a mixed solution of cupric chloride and hydrochloric acid to form an interconnecting pattern made up of the metal thin films and an electrolytic copper plating film. Finally, annealing was conducted at 170° C. for 30 minutes to obtain a circuit board having an interconnecting pattern on each side, two in all.

With the outer layer of the multilayer circuit board having an interconnecting pattern on each side, obtained as mentioned above, used as the first layer, insulation layers and conductor layers were repeatedly formed using the aforesaid internal layer substrate, thereby obtaining a multilayer circuit board having six layers in all on both sides. The results of estimation are reported in Table 1.

Example 2

A multilayer circuit board having six layers in all on both sides, were obtained following Example 1 with the exception that 130 parts of the flame retardant slurry B obtained in Preparation Example 2 were used in place of the flame retardant slurry A in Example 1. The results of estimation are reported in Table 1.

Comparative Example 1

A multilayer circuit board having six layers in all on both sides, were obtained following Example 1 with the exception that 200 parts of the flame retardant slurry C obtained in Preparation Example 3 were used in place of the flame retardant slurry A in Example 1. The results of estimation are reported in Table 1.

TABLE 1

|  | Secondary Particle Diameter of Varnish | | Interlayer Insulation Resistance | | Flame Retardancy |
| --- | --- | --- | --- | --- | --- |
|  | After 4 hr | After 48 hr | After 4 hr | After 48 hr |  |
| Ex. 1 | A | A | A | A | A |
| Ex. 2 | A | A | A | A | A |
| Comp. Ex. 1 | C | C | D | D | A |

From these results, it is understood that the inventive varnish, to which the surface treated flame retardant particles obtained by contact of the flame retardant with the phosphorus compound soluble in solvents are added, is improved in terms of the effect on holding back the occurrence of secondary particles even after a long-term storage. With the inventive varnish, it is thus possible to obtain an electrical insulation film having improved interlayer insulation resistance and flame retardancy.

Example 3

One hundred (100) parts of the maleic anhydride modified alicyclic olefin polymer as prepared in Example 1, 37.5 parts of bisphenol A bis(propylene glycol glycidyl ether)ether, 12.5 parts of 1,3-diallyl-5-[2-hydroxy-3-phenyloxypropyl] isocyanurate, 6 parts of dicumyl peroxide, 0.1 part of 1-benzyl-2-phenylimidazole, 5 parts of 2-[2-hydroxy-3,5-bis(α,α-dimethylbenzyl)phenyl] benzotriazole and 150 parts of the flame retardant slurry D obtained in Preparation Example 4 were dissolved in a solvent mixture made up of 168 parts of xylene and 28 parts of cyclo-pentanone to obtain a varnish. Four hours later, this varnish was estimated for its secondary particle diameter and resistance to high temperature-and-humidity. The results are reported in Table 2.

The remnant of the varnish used for those estimations was coated on a polyethylene naphthalate film of 300 mm square and 50 μm in thickness by means of a die coater, and then dried at 120° C. for 10 minutes in a nitrogen-prevailing oven to obtain a dry film having a carrier film, wherein the resin formed material had a thickness of 40 μm.

Apart from this, a 0.1% by weight isopropyl alcohol solution of 2-dibutylamino-4,6-s-triazine was prepared. A 0.8-mm thick double-sided copper-clad substrate (a core material that was obtained by impregnating a glass cloth with a varnish containing glass filler and a halogen-free epoxy resin and had copper claddings on both sides) provided with an internal layer circuit having a line width of 50 μm, an interline distance of 50 μm and a conductor thickness of 18 μm and micro-etched on its surface was dipped in that solution at 25° C. for 1 minute, and then dried at 90° C. for 15 minutes in a nitrogen-substituted oven to form a primer layer, thereby obtaining an internal layer substrate.

The aforesaid dry films each with a carrier film were superposed at their resin surfaces on both sides of the double-sided copper-clad substrate of the internal layer substrate. Then, primary pressing was applied to the resultant assembly at a reduced pressure of 200 Pa in a vacuum laminator machine having upper and lower heat-resistant rubber press plates; a 60-second thermo-compression was carried out at a temperature of 110° C. and a pressure of 1.0 MPa. Subsequently, secondary pressing was applied to the assembly at a reduced pressure of 200 Pa in a vacuum laminator machine having upper and lower heat-resistant rubber press plates each covered with a metallic press plate; a 60-second thermocompression was performed at a temperature of 140° C. and a pressure of 1.0 MPa. After this, only the polyethylene naphthalate film was peeled off, and the assembly was allowed to stand alone at 140° C. for 30 minutes, and then at 170° C. for 60 minutes in a nitrogen-prevailing oven to form an electrical insulation layer on the internal layer substrate.

Using the third harmonic of UV-YAG laser, an interlayer-connection via hole of 30 μm in diameter was formed through an insulation layer portion of the obtained multilayer substrate.

Then, the multilayer substrate with the via hole formed through it was plasma treated under the following conditions; plasma treatment was carried out at a frequency of 13.56 MHz, an output of 100 W and a gas pressure of 0.8 Pa, using a mixed gas consisting of argon gas and nitrogen gas at a volume ratio of 50:50. The plasma treatment was performed at a temperature 25° C. for 5 minutes.

Next, RF sputtering was carried out in an argon atmosphere under conditions of a frequency of 13.56 MHz, an output of 400 W and a gas pressure of 0.8 Pa to form a 0.03-μm thick chromium film on the surface of the thus plasma treated circuit substrate at a rate of 4.6 Å per second. Then, sputtering was performed to form a 0.1-μm thick nickel film and, then, a 0.3-μm thick copper thin film at a rate of 9.1 Å per second, thereby obtaining a multilayer substrate having metal thin films.

A commercially available photosensitive dry film was bonded by thermocompression to the surface of the multilayer substrate. After a given pattern mask was in close contact with the dry film for exposure, development was carried out to obtain a resist pattern. Then, electrolytic copper plating was applied to a resist pattern-free area to form an electrolytic copper plating film of 18 μm in thickness. Subsequently, the resist pattern was stripped off with a stripper and etching was carried out using a mixed solution of cupric chloride and hydrochloric acid to form an interconnecting pattern made up of the metal thin films and an electrolytic copper plating film. Finally, annealing was conducted at 170° C. for 30 minutes to obtain a circuit board having an interconnecting pattern on each side, two in all.

With the multilayer circuit board having an interconnecting pattern on each side, obtained as mentioned above, used as the internal layer substrate, insulation layers and conductor layers were repeatedly formed as described above, thereby obtaining a multilayer circuit board having six layers in all on both sides. This substrate was used for the estimation of flame retardancy and interlayer insulation resistance. The results of estimation are reported in Table 2.

Example 4

The secondary particle diameter and resistance to high temperature-and-humidity were estimated following Example 3 with the exception that 150 parts of the flame retardant slurry E obtained in Preparation Example 5 were used in place of the flame retardant slurry D in Example 3. Further, a multilayer circuit board having six layers in all on both sides as obtained in Example 1 was used for the estimation of flame retardancy and interlayer insulation resistance. The results of estimation are reported in Table 2.

Comparative Example 2

The secondary particle diameter and resistance to high temperature-and-humidity were estimated following Example 1 with the exception that 150 parts of the flame retardant slurry F obtained in Preparation Example 6 were used in place of the flame retardant slurry D in Example 3. Further, a multilayer circuit board having six layers in all on both sides as obtained in Example 1 was used for the estimation of flame retardancy and interlayer insulation resistance. The results of estimation are reported in Table 2.

TABLE 2

| | Secondary Particle Diameter | Resistance to High Temperature-and-Humidity | Flame Retardancy | Interlayer Insulation Resistance |
|---|---|---|---|---|
| Ex. 3 | A | A | A | A |
| Ex. 4 | A | A | A | A |
| Comp. Ex. 2 | C | B | A | D |

From these results, it is understood that the inventive varnish, with the addition thereto of the surface treated flame retardant particles obtained by contact of the flame retardant with the organosilicon compound or the dispersant having a carboxyl group, is improved in terms of the effect on holding back the occurrence of large particles having a secondary particle diameter in excess of 30 μm which may otherwise be caused by agglomeration of the flame retardant particles even after a long-term storage, and less susceptible to give rise to particulate deposits on the surface of the electrical insulation layer even under high temperature-and-humidity conditions. With the inventive varnish, it is thus possible to obtain an electrical insulation film having improved interlayer insulation resistance and flame retardancy.

INDUSTRIAL APPLICABILITY

The invention provides a varnish comprising a curable resin composition capable of yielding an electrical insulation film having improved flame retardancy and stabilized electrical properties such as interlayer insulation resistance and a production process for the same. The invention also provides a varnish comprising a curable resin composition capable of yielding an electrical insulation film having improved flame retardancy and electrical properties, and improved resistance to high temperature-and-humidity conditions as well.

The varnish of the invention ensures that the flame retardant has improved dispersion stability, and prevents agglomeration of the flame retardant particles even under high temperature-and-humidity conditions. The electrical insulation film obtained by use of the varnish of the invention is improved just only in interlayer insulation but also in resistance to high temperature-and-humidity. A multilayer circuit board having an electrical insulation film of the invention is usable as a printed wiring board for mounting semiconductor devices such as CPUs or memories and many other mounting components in electronics such as computers and cellular phones.

Further, the invention provides a process for the preparation of flame retardant particles for incorporation in the aforesaid varnish, a flame retardant slurry containing said flame retardant particles, and a varnish preparation process using said flame retardant slurry.

The invention claimed is:
1. A varnish comprising:
an insulation resin,
a curing agent,
a flame retardant comprising, a salt of a basic nitrogenous compound with phosphoric acid that is dispersible as solid particles in an organic solvent, surface treated with at least one surface treatment agent selected from the group consisting of a phosphorus compound soluble in an organic solvent, an organopolysiloxane, and a dispersant having a carboxyl group,
and an organic solvent.

2. The varnish according to claim 1, wherein said surface treated flame retardant particles have a primary particle average major axis of 0.01 to 5 μm and an average aspect ratio of up to 5 and contain up to 10% by number of particles having a major axis of greater than 10 μm.

3. The varnish according to claim 1, wherein said surface treated flame retardant particles are dispersed as particles having a secondary particle diameter of up to 30 μm in the varnish.

4. The varnish according to claim 1, wherein said surface treated flame retardant particles are obtained by surface treatment of the salt of a basic nitrogenous compound with phosphoric acid by contact with a surface treatment agent in an organic solvent, wherein said salt of a basic nitrogenous compound with phosphoric acid is wet milled as needed.

5. The varnish according to claim 1, wherein said phosphorus compound soluble in an organic solvent is an alkyl acid phosphate with an alkyl group having at least 8 carbon atoms.

6. The varnish according to claim 1, wherein said organopolysiloxane is an organopolysiloxane having a functional group selected from the group consisting of an amino group, an epoxy group, a carboxyl group, an acrylate group, a methacrylate group, a hydroxyl group, a mercapto group, a vinyl group, and a halogen atom.

7. The varnish according to claim 1, wherein said dispersant having a carboxyl group is a high-molecular weight dispersant having a structure in which the carboxyl group is bonded to a high-molecular weight compound selected from the group consisting of a polyester resin, an acrylic resin, a polyurethane resin, a polyether resin, and an alkyd resin.

8. The varnish according to claim 1, wherein said insulation resin is at least one insulation resin selected from the group consisting of an epoxy resin, a maleimide resin, a (meth) acrylic resin, a diallyl phthalate resin, a triazine resin, an alicyclic olefin polymer, an aromatic polyether polymer, a benzocyclobutene polymer, a cyanate ester polymer, a liquid crystal polymer, and a polyimide resin.

9. The varnish according to claim 8, wherein said alicyclic olefin polymer is an alicyclic olefin polymer having a polar group selected from the group consisting of a hydroxyl group, a carboxyl group, an alkoxyl group, an epoxy group, a glycidyl group, an oxycarbonyl group, a carbonyl group, an amino group, an ester group, and a carboxylic anhydride group.

10. The varnish according to claim 1, which contains, per 100 parts by weight of the insulation resin, 1 to 100 parts by weight of the curing agent and 0.1 to 80 parts by weight of the surface treated flame retardant particles, and further contains an organic solvent in an amount sufficient to uniformly disperse or dissolve the insulating resin, the curing agent and the flame retardant therein.

11. A formed material, which is obtained by applying and drying a varnish of claim 1 on a substrate.

12. The formed material according to claim 11, which is a film or sheet.

13. An electrical insulation film, which is obtained by curing the film or sheet according to claim 12.

14. A multilayer structure, wherein an electrical insulation layer obtained by curing the formed material according to claim 11 is formed on a substrate having a conductor circuit layer.

15. The multilayer structure according to claim 14, wherein said formed material is a film or sheet, and wherein said electrical insulation layer is an electrical insulation film formed by thermocompression of the film or sheet on a substrate having a conductor circuit layer.

16. A flame retardant slurry, wherein flame retardant particles comprising, a salt of a basic nitrogenous compound with phosphoric acid that is dispersible as solid particles in an organic solvent, surface treated with at least one surface treatment agent selected from the group consisting of a phosphorus compound soluble in an organic solvent, an organopolysiloxane, and a dispersant having a carboxyl group, are dispersed in an organic solvent.

17. The flame retardant slurry according to claim 16, wherein said surface treated flame retardant particles are dispersed as particles having a primary particle average major axis of 0.01 to 5 μm and an average aspect ratio of up to 5 and containing up to 10% by number of particles having a major axis of greater than 10 μm.

18. A process for preparing a surface treated flame retardant particle comprising:
bringing into contact, a flame retardant, comprising a salt of a basic nitrogenous compound with phosphoric acid that is dispersible as solid particles in an organic solvent, and at least one surface treatment agent selected from the group consisting of a phosphorus compound soluble in an organic solvent, an organopolysiloxane and a dispersant having a carboxyl group in an organic solvent, wherein said flame retardant is wet milled as needed.

19. A varnish preparation process comprising:
bringing a flame retardant comprising a salt of a basic nitrogenous compound with phosphoric acid that is dispersible as solid particles in an organic solvent in contact with at least one surface treatment agent selected from the group consisting of a phosphorus compound soluble in an organic solvent, an organopolysiloxane and a dispersant having a carboxyl group in an organic solvent, wherein said flame retardant is wet milled as needed, and
mixing the surface treated flame retardant particles dispersed in an organic solvent, an insulation resin and a curing agent, optionally followed by adding an organic solvent.

* * * * *